United States Patent
Park

(10) Patent No.: US 9,606,161 B2
(45) Date of Patent: Mar. 28, 2017

(54) APPARATUS AND METHOD FOR DIAGNOSING MALFUNCTION OF HIGH VOLTAGE RELAY DEVICE

(71) Applicant: LSIS CO., LTD., Anyang-si, Gyeonggi-do (KR)

(72) Inventor: Sung Sik Park, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 35 days.

(21) Appl. No.: 14/509,669

(22) Filed: Oct. 8, 2014

(65) Prior Publication Data

US 2015/0115972 A1    Apr. 30, 2015

(30) Foreign Application Priority Data

Oct. 24, 2013  (KR) .................. 10-2013-0127359

(51) Int. Cl.
    *G01R 31/08*  (2006.01)
    *G01R 31/00*  (2006.01)
    *G01R 31/327*  (2006.01)

(52) U.S. Cl.
    CPC ....... *G01R 31/006* (2013.01); *G01R 31/3278* (2013.01)

(58) Field of Classification Search
    CPC .......................... G01R 31/006; G01R 31/3278
    USPC ......................................... 324/503, 515, 522
    See application file for complete search history.

(56) References Cited

U.S. PATENT DOCUMENTS

| | | | |
|---|---|---|---|
| 2006/0071618 A1* | 4/2006 | Yudahira | B60L 3/0023 318/12 |
| 2007/0139005 A1 | 6/2007 | Osawa | |
| 2012/0191294 A1* | 7/2012 | Boiron | G01R 31/3278 701/33.8 |
| 2013/0106423 A1 | 5/2013 | Moon et al. | |

(Continued)

FOREIGN PATENT DOCUMENTS

| | | |
|---|---|---|
| CN | 201118218 | 9/2008 |
| CN | 102269790 A | 12/2011 |

(Continued)

OTHER PUBLICATIONS

European Patent Office Application Serial No. 14188260.5, Search Report dated Mar. 23, 2015, 7 pages.

(Continued)

*Primary Examiner* — Farhana Hoque
(74) *Attorney, Agent, or Firm* — Lee, Hong, Degerman, Kang & Waimey PC

(57) ABSTRACT

The apparatus for diagnosing malfunction of a high voltage relay includes: first and second relays configured to connect or disconnect a battery and a circuit using the battery as a power source in each electrode; a voltage measuring unit configured to measure a first voltage between a battery side terminal or a circuit side terminal, among terminals of the first relay, and a circuit side terminal or a battery side terminal, among terminals of the second relay, and measure a second voltage between the battery side terminals or between the circuit side terminals; and a controller configured to determine whether the first or second relay malfunctions based on the first and second voltage values measured by the voltage measuring unit by controlling connection and disconnection of the first or second relay.

8 Claims, 5 Drawing Sheets

(56) References Cited

U.S. PATENT DOCUMENTS

2013/0320986 A1* 12/2013 Shiraishi .............. G01R 31/327
324/415

FOREIGN PATENT DOCUMENTS

| | | |
|---|---|---|
| CN | 202159120 | 3/2012 |
| CN | 102511009 | 6/2012 |
| CN | 102540070 | 7/2012 |
| CN | 103085667 | 5/2013 |
| JP | H07167927 | 7/1995 |
| JP | 2007165253 | 6/2007 |
| JP | 2013-500548 | 1/2013 |
| JP | 2013188068 | 9/2013 |
| KR | 10-2013-0032504 | 4/2013 |

OTHER PUBLICATIONS

Japan Patent Office Application Serial No. 2014-211418, Office Action dated Aug. 25, 2015, 3 pages.
Korean Intellectual Property Office Application No. 10-2013-0127359, Office Action dated May 30, 2016, 5 pages.
Korean Intellectual Property Office Application Serial No. 10-2013-0127359, Notice of Allowance dated Oct. 7, 2016, 5 pages.
State Intellectual Property Office of the People's Republic of China Application No. 2014105757569, Notice of Allowance dated Jan. 24, 2017, 8 pages.

* cited by examiner

APPARATUS AND METHOD FOR DIAGNOSING MALFUNCTION OF HIGH VOLTAGE RELAY DEVICE

CROSS-REFERENCE TO RELATED APPLICATION

Pursuant to 35 U.S.C. §119(a), this application claims the benefit of earlier filing date and right of priority to Korean Application No. 10-2013-0127359, filed on Oct. 24, 2013, the contents of which are hereby incorporated by reference herein in its entirety.

BACKGROUND OF THE INVENTION

1. Field of the Invention

The present disclosure relates to an apparatus and method for diagnosing malfunction of a high voltage relay device.

2. Background of the Invention

Electric vehicles and hybrid electric vehicles (HEV) obtain driving energy by rotating a motor with electricity accumulated in a battery. Since vehicles do not obtain energy by burning fossil fuel like existing vehicles, an exhaust gas can be reduced.

Driving force of an electric vehicle using a motor is transmitted to a wheel through a transmission. Unlike engines, a torque-speed maximum capability curve of a motor is continuous according to speeds, and thus, the motor has a single uniform fixed reduction gear ratio, and an inverter should control the motor at a high speed (in general, at 0 to 12,000 rpm).

In general, as a control power source of an inverter included in an electric vehicle, a 12V lead storage battery like that of an engine vehicle is used, but a voltage of a battery input to the inverter is a high voltage ranging from DC 200V to 400V.

Here, as illustrated in FIG. 1, in order to protect the battery having a high voltage, a relay unit 3 is connected in series between the battery and the inverter. In this case, the relay unit 3 may include one or more relays 31 and 32 by which the battery 1 and the inverter 2 are connected in series in each electrode.

Since the relays 31 and 32 are connected to the battery 1 having a high voltage so as to be driven, when a contact of the relays 31 and 32 is melting-bonded (hereinafter, relays 31 and 32 may also be used together with "high voltage relays"), a high voltage may be unintentionally applied to a system.

In order to solve the problem, Korean Patent Laid Open Publication No. 10-2013-0079843 discloses an apparatus for determining contacts of relays 31 and 32 are melting-bonded.

FIG. 2 is a circuit diagram of the related art apparatus for determining whether contacts of relays are melting-bonded.

As illustrated in FIG. 2, in the related art apparatus for determining whether contacts of relays are melting-bonded, when the relay 31 having a positive (+) polarity is melting-bonded, a voltage supplied from a high voltage battery is dropped through a resistor R1 and a first LED 41 is turned through a first photocoupler PC1. Conversely, when the relay 32 having a negative (−) polarity is melting-bonded, a voltage supplied from the battery having a high voltage is dropped through a resistor R5 and a second LED 42 is turned on through a second photocoupler PC2.

In this manner, the related art apparatus for determining whether contacts of relays are melting-bonded is advantageous in that a user can determine whether relays 31 and 32 of the electrodes are melting-bonded with naked eyes. However, whether the a contact of the high voltage relays 31 and 32 are melting-bonded is determined by using a current flowing in the circuits including various resistors R1 to R8 and the photocouplers PC1 and PC2, additional circuits and components are required.

In addition, due to the additional components, the related art apparatus for determining whether a contact of a relay is melting-bonded cannot reduce a size of a product to be designed and economic efficiency thereof is degraded.

Thus, a technique for solving the foregoing problem is urgently required.

SUMMARY OF THE INVENTION

Therefore, an aspect of the detailed description is to provide an apparatus and method for diagnosing malfunction of a high voltage relay capable of diagnosing whether a contact of a high voltage relay is melting-bonded.

To achieve these and other advantages and in accordance with the purpose of this specification, as embodied and broadly described herein, an apparatus for diagnosing malfunction of a high voltage relay may include: first and second relays configured to connect or disconnect a battery and a circuit using the battery as a power source in each electrode; a voltage measuring unit configured to measure a first voltage between a battery side terminal or a circuit side terminal, among terminals of the first relay, and a circuit side terminal or a battery side terminal, among terminals of the second relay, and measure a second voltage between the battery side terminals or between the circuit side terminals; and a controller configured to determine whether the first or second relay malfunctions based on the first and second voltage values measured by the voltage measuring unit by controlling connection and disconnection of the first or second relay.

The controller may alternately turn on the first and second relays and determine whether a relay in an ON state malfunctions based on the first voltage value and the second voltage value.

The controller may turn on the first relay and turn off the second relay, and determine whether the first relay malfunctions by comparing the voltage value between the battery side terminal of the first relay and the circuit side terminal of the second relay with the voltage value between the circuit side terminals.

The controller may turn off the first relay and turn on the second relay, and determine whether the second relay malfunctions by comparing the voltage value between the battery side terminal of the first relay and the circuit side terminal of the second relay with the voltage value between the battery side terminals.

The controller may determine whether the second voltage value is equal to a pre-set output voltage value of the battery or whether the second voltage value is equal to the voltage between the circuit side terminals in the state in which power is not applied to the circuit.

Before determining whether the first relay or the second relay malfunctions, the controller may turn off the first and second relays and determine whether a voltage measured by the voltage measuring unit is 0.

The apparatus may further include a notifying unit configured to generate a sound or light outwardly when the controller determines that the first or second relay malfunctions.

In the apparatus and method for diagnosing a high voltage relay according to embodiments, whether a relay connected in series between a high voltage battery and an inverter is melting-bonded can be determined.

Also, in the apparatus and method for diagnosing a high voltage relay according to embodiments, the number of additional components is smaller than that of the related art apparatus for determining whether a contact of a relay is melting-bonded, and thus, the size of a product can be reduced and manufacturing costs can also be reduced.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Hereinafter, the embodiments of the present invention will be described with reference to the accompanying drawings, in which like numbers refer to like elements throughout although the embodiments are different, and a description of the like elements a first embodiment will be used for those of the different embodiment. In the following description, usage of suffixes such as 'module', 'part' or 'unit' used for referring to elements is given merely to facilitate explanation of the present invention, without having any significant meaning by itself. In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings.

Apparatus for Diagnosing Malfunction of High Voltage Relay

Figure 3A:
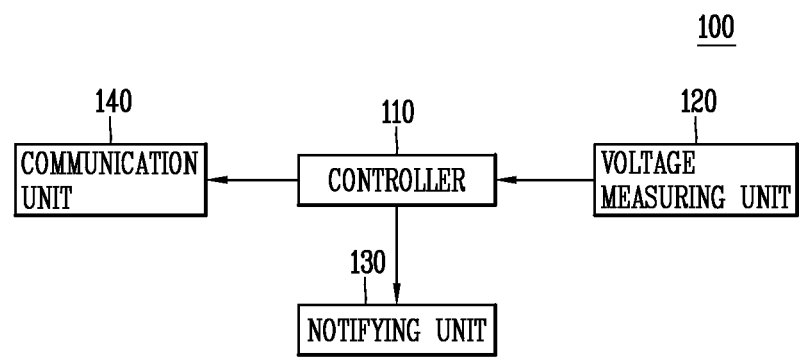
FIG. 3A is a block diagram illustrating an apparatus for diagnosing malfunction of a high voltage relay according to an embodiment of the present disclosure.
Figure 3B:
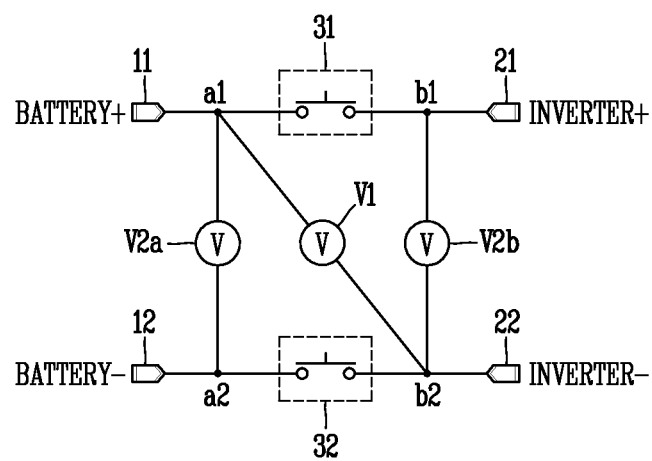
FIG. 3B is a view illustrating positions of voltages measured by a voltage measuring unit according to an embodiment of the present disclosure in a circuit including a high voltage relay.

FIG. 3A is a block diagram illustrating an apparatus for diagnosing malfunction of a high voltage relay according to an embodiment of the present disclosure, and FIG. 3B is a view illustrating positions of voltages measured by a voltage measuring unit according to an embodiment of the present disclosure in a circuit including a high voltage relay.

Figure 1:
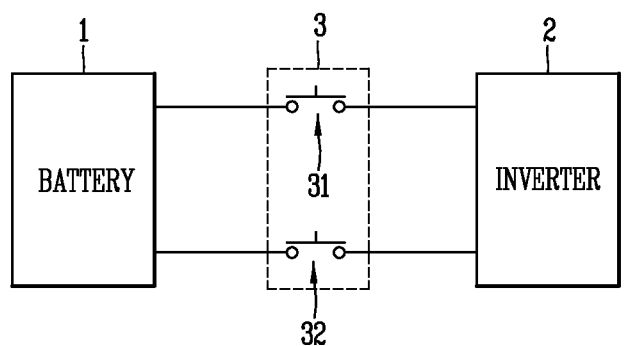
FIG. 1 a block diagram schematically illustrating connection between a battery for a general electric vehicle and an inverter.
Figure 2:
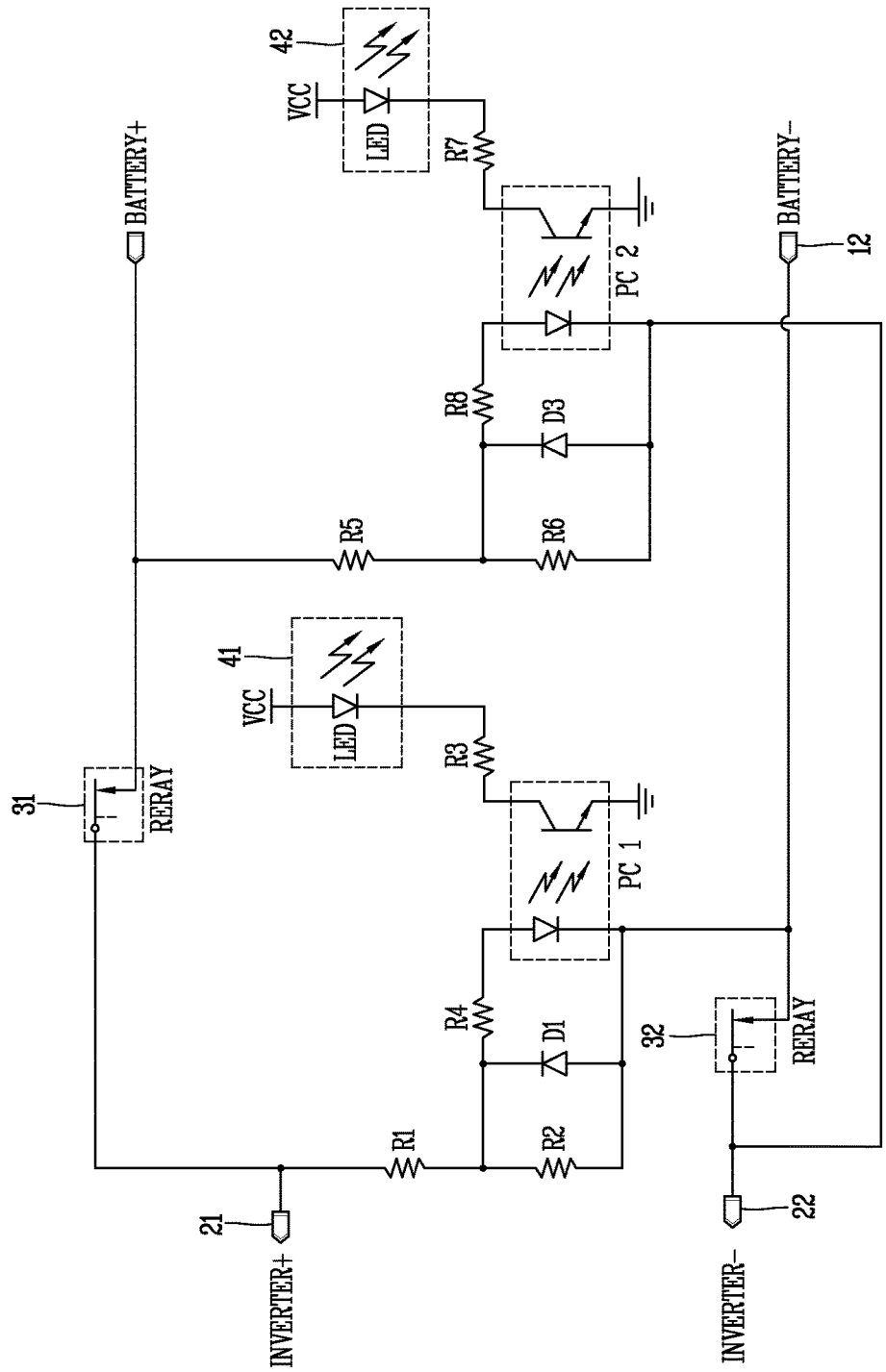
FIG. 2 is a circuit diagram of the related art apparatus for determining whether a contact of a relay is used.

As described above with reference to FIG. 1, a high voltage relay is connected in series between a battery 1 and an inverter 2 (a circuit using the battery 1), and here, a plurality of high voltage relays may be provided for electrodes. Here, in the present disclosure, for the purposes of description, a relay 31 connected between a positive (+) polarity 11 of a battery and a positive (+) polarity 21 of an inverter will be referred to as a first relay, and a relay 32 connected between a negative (−) polarity 12 of a battery and a negative (−) polarity 22 of an inverter will be referred to as a second relay, but the present disclosure is not limited thereto.

As illustrated in FIG. 3A, an apparatus 100 for diagnosing malfunction of a high voltage relay according to an embodiment includes a controller 110 and a voltage measuring unit 120. Hereinafter, components of the apparatus 100 for diagnosing malfunction of a high voltage relay according to the embodiment will be described in detail.

The voltage measuring unit 120 measures a voltage V1 (hereinafter, referred to as a "first voltage") between a battery side terminal a1 among terminals of a first relay 31 and a circuit side terminal b2 among terminals of a second relay 32 or between a circuit side terminal b1 among the terminals of the first relay 31 and a battery side terminal a2 among the terminals of the second relay 32, and measures a voltage V2a between both terminals a1 and a2 of the battery side or a voltage V2b between both terminals b1 and b2 of the circuit side (hereinafter, referred to as "second voltage").

However, for the purposes of description, in the present disclosure, the "first voltage V1" is a voltage between the battery side terminal a1 among the terminals of the first relay 31 and the circuit side terminal b2 among the terminals of the second relay 32, but the present disclosure is not limited thereto.

As the voltage measuring unit 120, various known means that may be able to measure the first voltage V1 or the second voltage V2a or V2b may be employed, without being limited to any one voltage measuring means.

The controller 110 controls connection and disconnection of the first relay 31 or the second relay 32 and determines whether the first relay 31 or the second relay 32 malfunctions based on the first voltage V1 value and the second voltage V2a and V2b values measured by the voltage measuring unit 120.

A method for determining whether the first relay 31 or the second relay 32 malfunctions by the controller 110 will be described in detail. First, in a state in which both the first and second relays 31 and 32 are turned off, the controller 180 may measure a voltage between both terminals a1 and a2 of the battery side (hereinafter, referred to as an "default battery voltage") through the voltage measuring unit 120 and store the measured voltage in advance, and also measures a voltage between both terminals b1 and b2 of the circuit side (hereinafter, referred to as an "default circuit voltage") with respect to the circuit to which power has not been applied, and store the measured voltage in advance. Alternatively, the default battery voltage and the default circuit voltage may be set by a user in advance and stored.

Also, as described hereinafter, before determining whether the first and second relays 31 and 32 malfunction, in a state in which both the first and second relays 31 and 32 are turned off, the controller 110 may determine whether the first voltage V1 value is 0V (hereinafter, referred to as a "first condition"), whether the voltage V2a value between the both terminals a1 and a2 of the battery side, among the second voltage values, is equal to a default battery voltage value (hereinafter, referred to as a "second condition"), or whether the voltage V2b value between the both terminals b1 and b2 of the circuit side, among the second voltage values, is equal to a default circuit voltage value (hereinafter, referred to as a "third condition"), through the voltage measuring unit 120. Namely, before determining whether the first and second relays 31 and 32 malfunction, the controller 110 may determine whether at least one among the first to third conditions is met, and determine whether the first and second relays 31 and 32 normally operate as described hereinafter only when at least one among the first to third conditions is met.

Figure 4A:
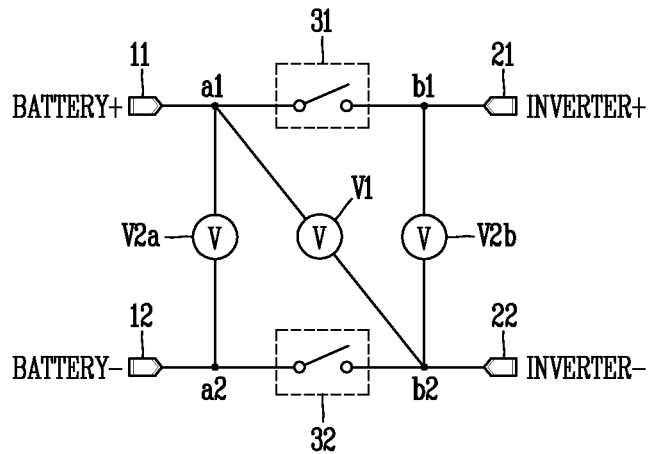
FIGS. 4(a) through 4(c) are views illustrating positions of voltages measured by the apparatus for diagnosing malfunction of a high voltage relay according to an embodiment of the present disclosure and a state of a relay.
Figure 4B:
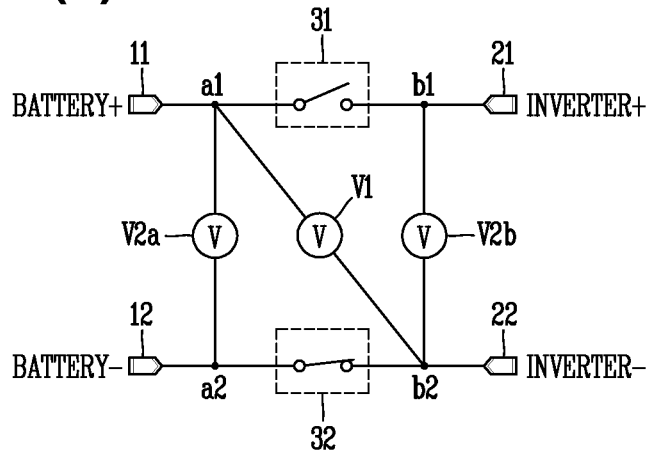
Figure 4C:
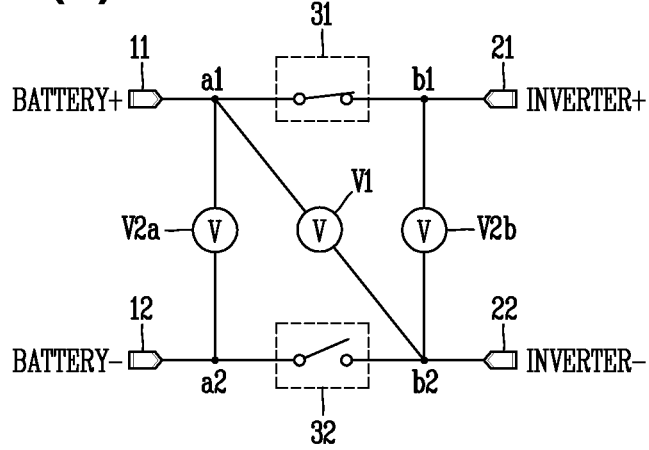

Thereafter, in order to determine whether a contact of the first relay 31 is melting-bonded, the controller 110 may turn on the first relay 31 and turn off the second relay 32 and use the first voltage V1 value and the second voltage V2a and V2b values measured by the voltage measuring unit 120 in that state (please refer to FIG. 4(c). Namely, as illustrated in FIG. 4(c), when it is determined that the V2a voltage value is equal to the default battery voltage value, the V2b voltage value is equal to the default circuit voltage value, and the first voltage value is equal to the V2b voltage value, the controller 110 may determine that the first relay 31 normally operates.

Also, in order to determine whether a contact of the second relay 32 is melting-bonded, the controller 110 may turn off the first relay 31 and turn on the second relay 32 and use the first voltage V1 value and the second voltage V2a and V2b values measured by the voltage measuring unit 120 in that state (please refer to FIG. 4(b). Namely, as illustrated in FIG. 4(b), when it is determined that the V2a voltage value is equal to the default battery voltage value, the V2b voltage value is equal to the default circuit voltage value, and the first voltage value is equal to the V2a voltage value, the controller 110 may determine that the second relay 32 normally operates.

Figure 5:
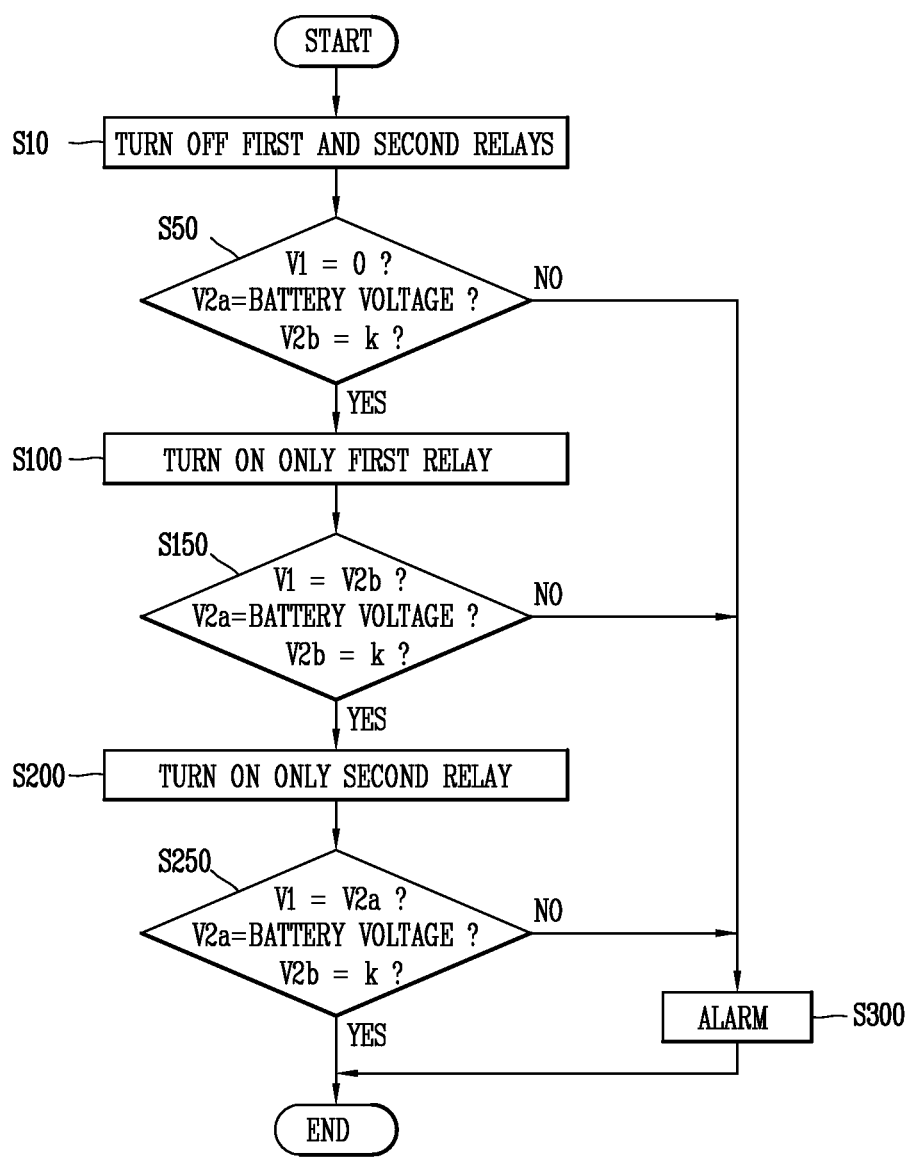
FIG. 5 is a flow chart illustrating processes of a method for diagnosing malfunction of a high voltage relay according to an embodiment of the present disclosure.

In this case, as for order of determining whether the contact of the first or second relay 31 or 23 is melting-bonded, whether the first relay 31 malfunctions may be determined and whether the second relay 32 malfunctions may be subsequently determined as illustrated in FIG. 5, but the present disclosure is not limited thereto and determining whether a certain relay malfunctions may be preferentially performed.

However, in order to continuously determine whether a plurality of relays malfunction, the controller may turn on a certain relay, among relays which have not been determined yet whether they malfunction, and turn off the other remaining relays, and determine whether a contact of the relay in the ON state is melting-bonded by using the first voltage V1 value and the second voltage V2a and V2b values as described above.

For example, the controller 110 may alternately turn on and off the first relay 31 and turn off and on the second relay 32 to correspond thereto, and determine whether the relay in the ON state malfunctions by using voltage values measured by the voltage measuring unit 120 in each state, whereby the controller 110 may continuously determine whether the plurality of relays malfunction.

The apparatus 100 for diagnosing malfunction of a high voltage relay according to an embodiment may further include a notifying unit 130.

The notifying unit 130 may be included in the controller 110 or may be electrically connected to the controller 110. When the controller 110 determines that any one of the plurality of relays 31 and 32 malfunctions, the notifying unit generates a sound or light outwardly to allow a user to audibly or visually recognize that the relays 31 and 32 need to be checked.

The apparatus 100 for diagnosing malfunction of a high voltage relay according to an embodiment may further include a communication unit 140 included in the controller 110 or electrically connected to the controller 110. When the controller 110 determines that any one of the plurality of relays 31 and 32 malfunctions, the communication unit 140 may transmit a fault signal to a remote terminal or server to inform a remote user about the current state.

In this manner, unlike the related art in which whether high voltage relays 31 and 32 are melting-bonded is determined by using a current flowing in the circuit, the apparatus 100 for diagnosing malfunction of a high voltage relay according to an embodiment determines whether the high voltage relays 31 and 32 are melting-bonded by using a voltage between nodes, and thus, an additional circuit and component are not required. Also, since whether a contact of the high voltage relays 31 and 32 is melting-bonded is determined even with a smaller number of components, the size of a product of the diagnosing apparatus and manufacturing costs can be reduced.

Electric Vehicle

An electric vehicle may include an apparatus for diagnosing malfunction of a high voltage relay according to an embodiment.

As discussed above, as illustrated in FIG. 1, an electric vehicle includes a motor providing driving force of an electric vehicle body with electricity charged in a high voltage battery in place of existing liquid fuel (for example, gasoline, diesel oil, or the like), an inverter 2 for controlling the motor, a battery 1 applying electricity of high voltage, and a relay unit 3 for protecting the battery 1 having a high voltage.

In order to determine whether at least one relay included in the relay unit 3 of the electric vehicle malfunctions, the electric vehicle may include apparatus for diagnosing malfunction of a high voltage relay according to an embodiment.

Method for Diagnosing Malfunction of High Voltage Relay

FIG. 5 is a flow chart illustrating processes of a method for diagnosing malfunction of a high voltage relay according to an embodiment of the present disclosure.

Hereinafter, each component will be described with reference to FIGS. 4(a) through 4(c), and descriptions of the components the same as those of the former embodiment will be omitted.

As illustrated in FIG. 5, in the method for diagnosing malfunction of a high voltage relay according to an embodiment, the controller 110 controls connection and disconnection of the first and second relays 31 and 32 and determines whether the first or second relay 31 or 23 malfunctions based on first and second voltage values V1, V2a, and V2b measured by the voltage measuring unit 120.

In detail, in order to determine whether a contact of the first relay 31 is melting-bonded, the controller 110 may turn on the first relay 31 and turn off the second relay 32 in step S100 and use the first voltage V1 value and the second voltage V2a and V2b values measured by the voltage measuring unit 120 in step S150. Namely, when it is determined that the V2a voltage value is equal to the default battery voltage value, the V2b voltage value is equal to the default circuit voltage value, and the first voltage value V1 is equal to the V2b voltage value, the controller 110 may determine that the first relay 31 normally operates.

Also, in order to determine whether a contact of the second relay 32 is melting-bonded, the controller 110 may turn off the first relay 31 and turn on the second relay 32 in step S200 and use the first voltage V1 value and the second voltage V2a and V2b values measured by the voltage measuring unit 120 in step S250. Namely, when it is determined that the V2a voltage value is equal to the default battery voltage value, the V2b voltage value is equal to the default circuit voltage value, and the first voltage value V1 is equal to the V2a voltage value, the controller 110 may determine that the second relay 32 normally operates.

In this case, as for order of determining whether the contact of the first or second relay 31 or 23 is melting-bonded, whether the first relay 31 malfunctions may be determined and whether the second relay 32 malfunctions may be subsequently determined as illustrated in FIG. 5, but the present disclosure is not limited thereto and determining whether a certain relay malfunctions may be preferentially performed.

However, in order to continuously determine whether a plurality of relays malfunction, the controller may turn on a certain relay, among relays which have not been determined yet as to whether they malfunction, and turn off the other remaining relays, and determine whether a contact of the relay in the ON state is melting-bonded by using the first voltage V1 value and the second voltage V2a or V2b value as described above. The controller 110 may repeatedly perform this process. After determining whether one relay malfunctions, the controller 110 may turn off all the relays (please refer to FIG. 4(a)).

Meanwhile, according to an embodiment, before it is determined whether the relays 31 and 32 malfunction, in a state in which both the first and second relays 31 and 32 are turned off in step S10, it is determined whether at least one of the first to third conditions is met in step S50, and when it is determined whether at least one of the first to third conditions is met, whether each of the relays operates normally may be determined.

On the other hand, when the first to third conditions are not met, it is determined that the first and/or the second relays 31 and 32 malfunction, and a sound or light is generated outwardly trough the notifying unit 130, so that the user may audibly or visually recognize that the relays 31 and 32 are required to be checked (S300). In addition, the controller 110 may inform a remote user that the first and/or second relays 31 and 32 malfunction, through the communication unit 140 that transmits and receives data to and from a remote terminal or server.

In this manner, unlike the related art, in the method for diagnosing malfunction of a high voltage relay according to an embodiment, whether the high voltage relays 31 and 32 are melting-bonded is determined by using a voltage between nodes, rather than by using a current flowing in the circuit, and thus, an additional circuit and component are not required.

Computer-Readable Recording Medium

The method for diagnosing malfunction of a high voltage relay according to an embodiment of the present disclosure described above may be implemented as computer commands which can be executed through various computer components and recorded in a computer-readable recording medium. The computer-readable recording medium may include program instructions, data files, data structures or a combination thereof. Program instructions recorded on the computer-readable recording medium may be particularly designed and structured for the present invention or available to those skilled in computer software. Examples of the computer-readable recording medium include hardware devices particularly configured to store and perform program instructions, such as magnetic mediums, such as a hard disk, a floppy disk, and a magnetic tape; optical mediums, such as a compact disk-read only memory (CD-ROM) and a digital versatile disc (DVD); magneto-optical mediums, such as floptical disks; a read-only memory (ROM); a random access memory (RAM); and a flash memory. The program instructions may include, for example, a high-level language code that can be executed by a computer using an interpreter, as well as a machine language code made by a complier. The hardware device described herein may be configured to be operated by one or more software modules to perform processing according to the present invention, and vice versa.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus and method for diagnosing malfunction of a high voltage relay, the apparatus comprising:
a first relay having a first terminal connected to a positive terminal of a battery and having a second terminal connected to a circuit using the battery as a power source, wherein the first relay is configured to connect or disconnect the battery and the circuit;
a second relay having a first terminal connected to a negative terminal of the battery and having a second terminal connected to the circuit, wherein the second relay is configured to connect or disconnect the battery and the circuit;
a first measuring unit configured to connect both terminals of the battery and measure a first voltage value across the both terminals of the battery;
a second measuring unit configured to connect both terminals of the circuit and measure a second voltage value across the both terminals of the circuit;
a third measuring unit connected to a battery side terminal among terminals of the first relay and a circuit side terminal among terminals of the second relay, and configured to measure a third voltage value between the battery side terminal and the circuit side terminal; and a controller configured to determine whether the first or second relay malfunctions based on the first voltage, the second voltage, and the third voltage values measured by the first, second, and third voltage measuring units by controlling connection and disconnection of the first or second relay.

2. The apparatus of claim 1, wherein the controller is further configured to alternately turn on the first and second relays and determine whether a relay in an ON state malfunctions based on the first voltage value and the second voltage value.

3. The apparatus of claim 1, wherein the controller is further configured to turn on the first relay and turn off the second relay, and determine whether the first relay malfunctions by comparing the voltage value between the battery side terminal of the first relay and the circuit side terminal of the second relay with the voltage value between the circuit side terminals.

4. The apparatus of claim 3, wherein the controller is further configured to determine whether the second voltage value is equal to a pre-set output voltage value of the battery or whether the second voltage value is equal to the voltage between the circuit side terminals in the state in which power is not applied to the circuit.

5. The apparatus of claim 1, wherein the controller is further configured to turn off the first relay and turn on the second relay, and determine whether the second relay malfunctions by comparing the voltage value between the battery side terminal of the first relay and the circuit side terminal of the second relay with the voltage value between the battery side terminals.

6. The apparatus of claim 5, wherein the controller is further configured to determine whether the second voltage value is equal to a pre-set output voltage value of the battery or whether the second voltage value is equal to the voltage between the circuit side terminals in the state in which power is not applied to the circuit.

7. The apparatus of claim 1, wherein, the controller is further configured to turn off the first and second relays and determine whether a voltage measured by the voltage measuring unit is 0 before determining whether the first relay or the second relay malfunctions.

8. The apparatus of claim 1, further comprising:
a notifying unit configured to generate a sound or light when the controller determines that the first or second relay malfunctions.

* * * * *